United States Patent [19]
Huang et al.

[11] Patent Number: 5,393,704
[45] Date of Patent: Feb. 28, 1995

[54] SELF-ALIGNED TRENCHED CONTACT (SATC) PROCESS

[75] Inventors: Cheng H. Huang, Hsin-Chu; Water Lur, Taipei, both of Taiwan, Prov. of China

[73] Assignee: United Microelectronics Corporation, Hsinchu, Taiwan, Prov. of China

[21] Appl. No.: 165,337

[22] Filed: Dec. 13, 1993

[51] Int. Cl.⁶ .................. H01L 21/44; H01L 21/48
[52] U.S. Cl. .................. 437/203; 437/41; 437/200; 437/228; 148/DIG. 20
[58] Field of Search .............. 437/192, 203, 228, 41, 437/200; 148/DIG. 20

[56] References Cited

U.S. PATENT DOCUMENTS

| | | | |
|---|---|---|---|
| 4,879,254 | 11/1989 | Tsuzuki et al. | 437/41 |
| 5,208,177 | 5/1993 | Lee | 437/47 |
| 5,225,372 | 7/1993 | Savkar et al. | 437/190 |
| 5,244,533 | 9/1993 | Kimura et al. | 437/162 |
| 5,272,099 | 12/1993 | Chou et al. | 437/162 |
| 5,316,977 | 5/1994 | Kunishima et al. | 437/162 |

*Primary Examiner*—Olik Chaudhuri
*Assistant Examiner*—H. Jey Tsai
*Attorney, Agent, or Firm*—George O. Saile

[57] ABSTRACT

A method of forming a self-aligned trenched contact in the fabrication of an integrated circuit is described. Semiconductor device regions are formed in and on a semiconductor substrate wherein the semiconductor device regions include gate electrodes on the surface of the semiconductor substrate and source/drain regions within the semiconductor substrate. Spacers are formed on the sidewalls of the gate electrodes. A layer of silicon oxide is deposited over the surface of the substrate wherein the silicon oxide contacts the source/drain regions within the substrate between the gate electrodes. The substrate is covered with a layer of photoresist which is patterned to provide an opening over the planned self-aligned trenched contact between the gate electrodes. The silicon oxide is etched away to provide an opening to the silicon substrate using the patterned photoresist and the sidewall spacers as a mask. A trench is etched into the silicon substrate within the opening using the photoresist and the sidewall spacers as a mask to form the self-aligned trenched contact opening. A conducting layer is deposited within the trenched opening to complete the contact in the manufacture of the integrated circuit device.

23 Claims, 3 Drawing Sheets

SELF-ALIGNED TRENCHED CONTACT (SATC) PROCESS

BACKGROUND OF THE INVENTION (1) Field of the Invention

The invention relates to the fabrication of integrated circuit devices, and more particularly, to a method of forming a self-aligned trenched contact opening in the fabrication of integrated circuits.

(2) Description of the Prior Art

The self-aligned contact (SAC) technology has been widely adopted to reduce device area in the fabrication of Very Large Scale Integrated Circuits (VLSI). However, as the contact area has decreased to the sub half-micron region, the contact resistance has become too large to be acceptable even with the use of the conventional SAC process. Therefore, the shrinkage of the device area is limited.

Referring to FIG. 1, there is illustrated a top view of a partially completed integrated circuit with active area 1. Contact area 2 is shown between polysilicon areas 3. Second polysilicon layer 4 completes the contact with area 2. FIG. 2 illustrates the cross-sectional representation of view 2—2 of FIG. 1. The size of the contact area is W×L, where W is the width of the contact area shown in FIG. 1 and L is the length of the area shown in FIG. 2. The spacing between the polysilicon lines 3 can be determined by adding the length of the contact area L to twice the size of the spacer 5.

U.S. Pat. No. 4,879,254 to Tsuzuki et al describes a self-aligned trenched contact method employing a shallow trench. The contacts described in this patent have a size on the order of 8 microns. Tsuzuki's invention requires a very shallow trench in order to prevent contact with the underlying N− region. In order to reduce contact resistance, the contact area must be increased. This calls for a deeper trench.

SUMMARY OF THE INVENTION

A principal object of the present invention is to provide an effective and very manufacturable method of forming a self-aligned trenched contact for sub 0.6-micron devices.

A further object of the invention is to provide such a robust method that significantly reduces the circuit area and provides an acceptable contact resistance.

In accordance with the objects of this invention a method of forming a self-aligned trenched contact in the fabrication of an integrated circuit is described. Semiconductor device regions are formed in and on a semiconductor substrate wherein the semiconductor device regions include gate electrodes on the surface of the semiconductor substrate and source/drain regions within the semiconductor substrate. Spacers are formed on the sidewalls of the gate electrodes. A layer of silicon oxide is deposited over the surface of the substrate wherein the silicon oxide contacts the source/drain regions within the substrate between the gate electrodes. The substrate is covered with a layer of photoresist which is patterned to provide an opening over the planned self-aligned trenched contact between the gate electrodes.

The silicon oxide is etched away to provide an opening to the silicon substrate using the patterned photoresist and the sidewall spacers as a mask. A trench is etched into the silicon substrate within the opening using the sidewall spacers as a mask to form the self-aligned trenched contact opening. A conducting layer is deposited within the trenched opening to complete the contact in the manufacture of the integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 3:
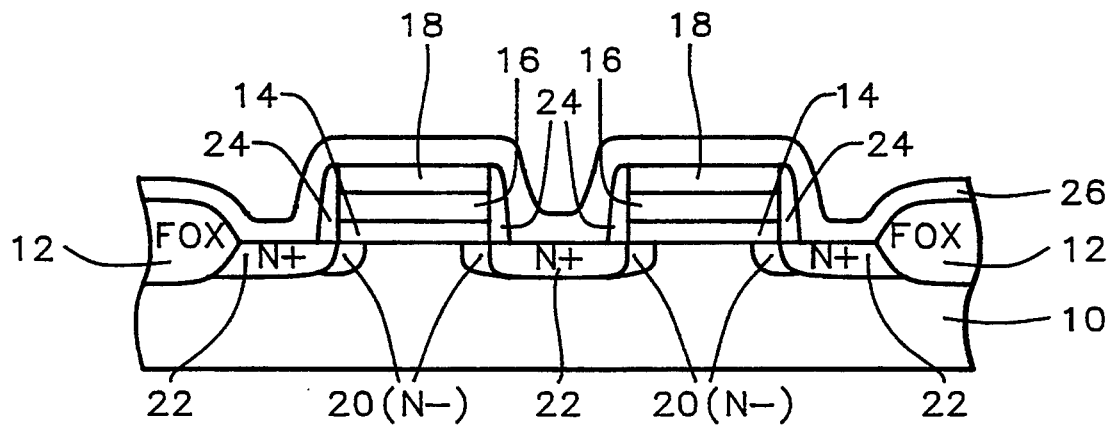
FIGS. 3 through 5 schematically illustrate in cross-sectional representation a preferred embodiment of this invention.

Referring now more particularly to FIG. 3, there is shown an illustration of a portion of a partially completed metal oxide field effect transistor (MOSFET). The semiconductor substrate 10 is preferably composed of silicon having a (100) crystallographic orientation. In an effort to simplify the description and the drawings the dielectric isolation between devices has been only partially shown and will not be described in detail, because they are conventional. For example, one method is described by E. Kooi in his U.S. Pat. No. 3,970,486 wherein certain selected surface portions of a silicon semiconductor substrate are masked against oxidation, and then the exposed unmasked surface is oxidized to grow a thermal oxide which in effect sinks into the silicon surface at the unmasked areas. The masked silicon remains as a mesa surrounded by the sunken silicon dioxide or Field Oxide pattern, FOX 12. Then semiconductor devices can be provided in the silicon mesas according to the following processes.

The surface of the silicon substrate 10 is thermally oxidized to form the desired gate oxide 14 thickness. The preferred thickness is between about 60 to 250 Angstroms.

The polysilicon layer 16 is deposited by low pressure chemical vapor deposition (LPCVD) to a thickness of between about 1000 to 4000 Angstroms. The layer may be doped or ion implanted.

Silicon oxide layer 18 is deposited to a thickness of between about 1000 to 3000 Angstroms. The layers 14, 16, and 18 are patterned by conventional lithography and anisotropic etching techniques to provide a desired pattern of gate electrodes as seen in FIG. 3.

The source/drain structure of the MOS FET may now be formed. The Figures show only an N channel MOSFET portion of an integrated circuit device. It is well understood by those skilled in the art that the P channel portion can be formed by simply substituting opposite polarities to those given for the N channel embodiment. Furthermore, a CMOS FET could be formed by making both N channel and P channel devices upon the same substrate.

The lightly doped drain (LDD) N− regions 20 are ion implanted. The typical dopant concentration for the regions 20 is between about 1 E 17 to 1 E 18 atoms/cm$^3$.

A second layer of silicon oxide is blanket deposited to a thickness of between about 1000 to 3000 Angstroms over the wafer's exposed surfaces. This layer is etched to form spacers 24 on the sidewalls of the gate electrode structures.

The LDD source/drain regions are completed by the ion implantation of N+ ions, such as arsenic or phosphorus to form the heavily doped regions 22. The preferred dopant concentration for these regions 22 is about 1 E 20 atoms/cm$^3$.

A layer 26 of silicon oxide is deposited by chemical vapor deposition (CVD) to a thickness of between about 500 to 1500 Angstroms over the surface of the wafer.

Figure 4:
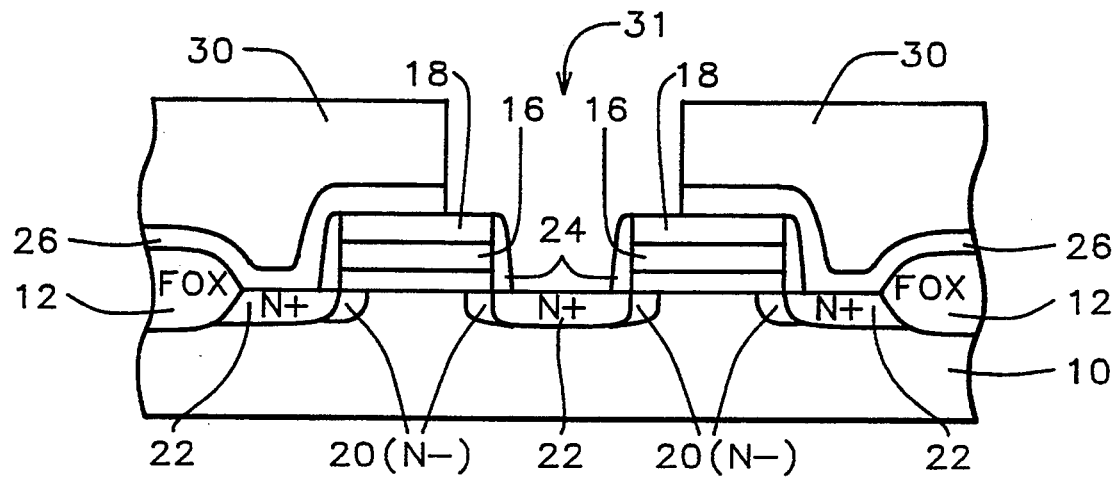

Referring now to FIG. 4, the self-aligned contact photolithography and etching is performed. A layer of photoresist 30 covers the surface of the wafer. It is exposed to actinic light, developed and patterned to provide an opening for the planned self-aligned trenched contact.

The silicon oxide layer 26 is etched away to form an opening 31 to the substrate using the patterned photoresist 30 as a mask. Reactive ion etching or the like may be used with chemicals of $CHF_3$ and $O_2$ or the like.

Figure 5:
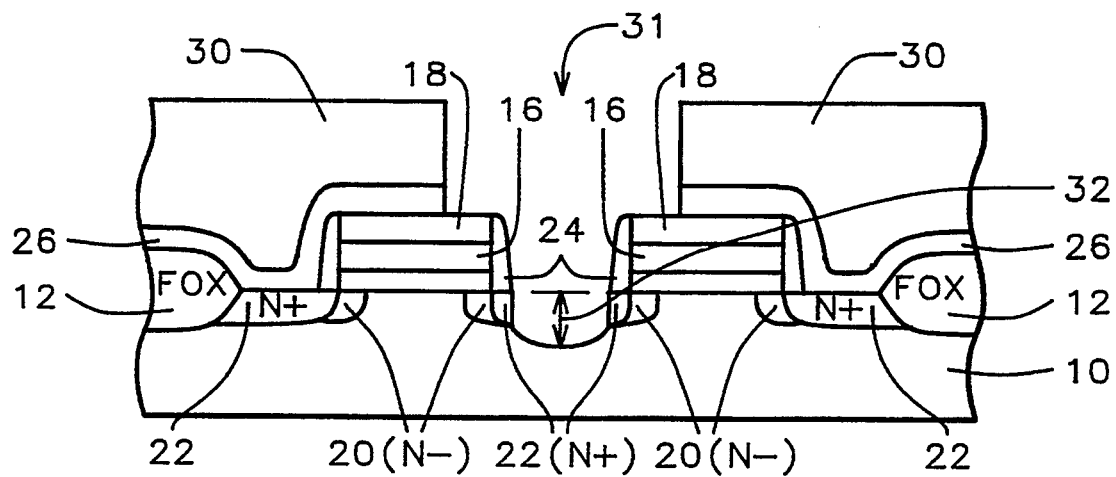

Referring to FIG. 5, a trench is etched into the silicon substrate under the contact opening 31. This is a self-aligned etching process using the spacers 24 as a mask. The photoresist mask 30 may be removed before or after the trench etching. Reactive ion etching using $CL_2$, HBr, or the like may be used. This trench serves to increase the contact area and hence, to reduce contact resistance. The trench has a depth 32 into the substrate of greater than about 0.25 microns, and preferably greater than about 0.5 microns.

Figure 6A:
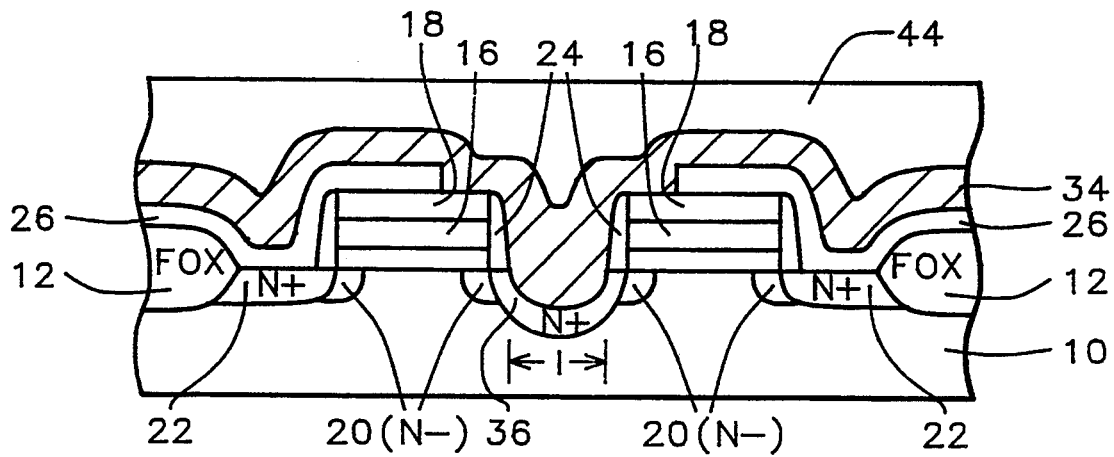
FIGS. 6A, 6B, and 6C schematically illustrate in cross-sectional representation three alternative ways of completing the contact of this invention.
Figure 6B:
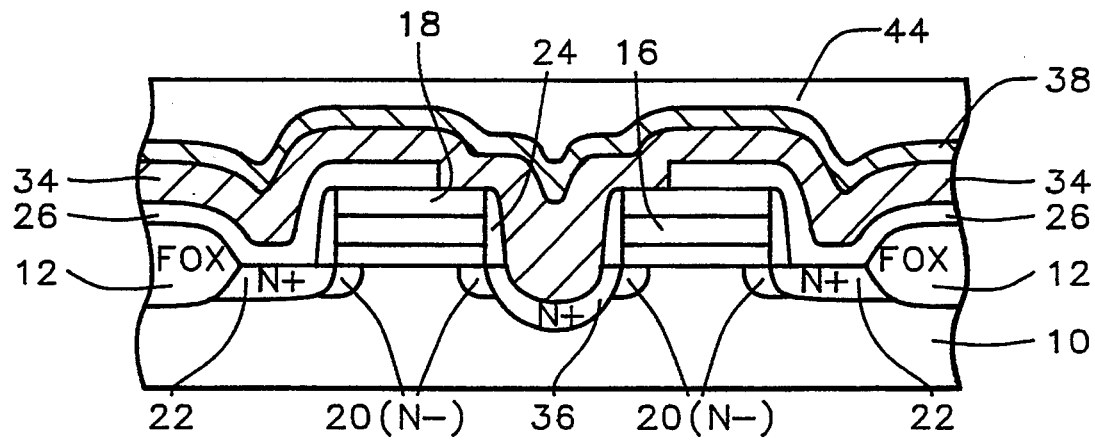
Figure 6C:
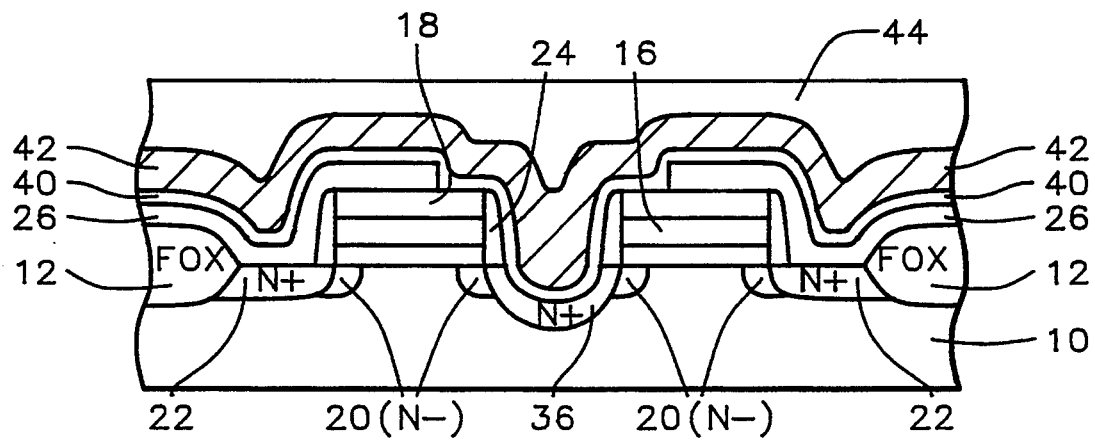

FIGS. 6A, 6B, and 6C depict three alternative ways of completing the contact within the opening 31. Referring now to FIG. 6A, a second polysilicon layer 34 is deposited over the surface of the wafer and within the trenched contact opening 31. This polysilicon layer is ion implanted with arsenic or phosphorus. Out diffusion from the polysilicon layer 34 within the trench forms the N+ contact diffusion region 36.

Referring now to FIG. 6B, after polysilicon layer 34 has been deposited and N+ contact diffusion region 36 has been formed, a polycide layer 38 is formed overlying polysilicon layer 34. This polycide layer 38 may be formed by depositing a layer of tungsten silicide to a thickness of between about 500 to 2000 Angstroms over the surface of layer 34.

A third alternative for completing the contact is illustrated in FIG. 6C. After the trench has been etched, arsenic or phosphorus is implanted into the trench with a dosage of between about 1 E 14 to 1 E 16 atoms/cm$^2$ and energy of between about 10 to 80 KeV. The wafer is heated to activate and form the N+ contact region 36. An optional barrier metal layer 40, composed of titanium nitride, titanium silicide, or the like, is deposited over the surface of the wafer and within the trenched contact to a preferred thickness of between about 150 to 1500 Angstroms. A metal layer 42 composed of, for example, aluminum or an aluminum alloy is deposited by sputtering, evaporation, or the like to a thickness of between about 2000 to 10,000 Angstroms.

The conducting layer—polysilicon, polycide, or metal—is patterned and covered with passivation layer 44 to complete fabrication of the integrated circuit.

The following Example has been included to show the important features of the invention and to aid in the understanding thereof. Variations may be made by one skilled in the art without departing from the spirit and scope of the invention.

EXAMPLE

Figure 1:
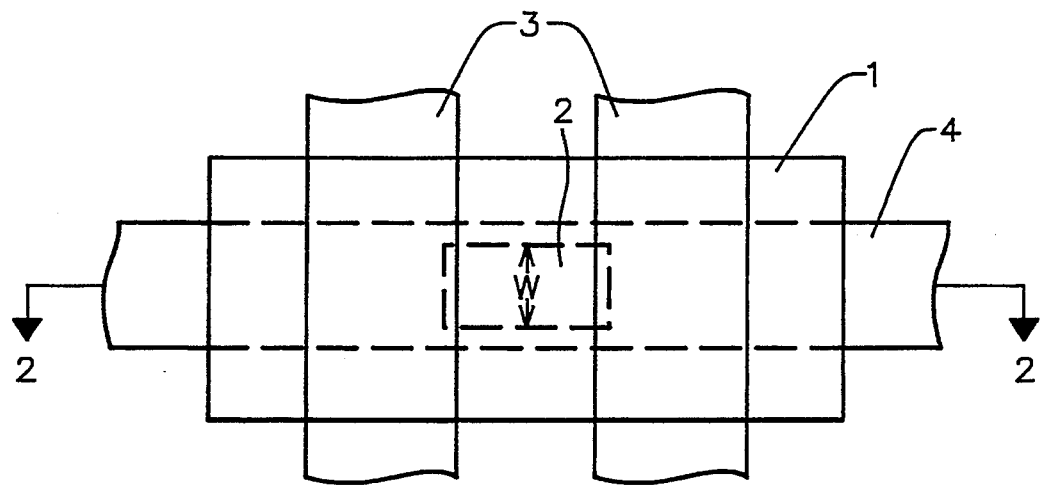
FIG. 1 schematically illustrates a top view of a self-aligned contact of the prior art.
Figure 2:
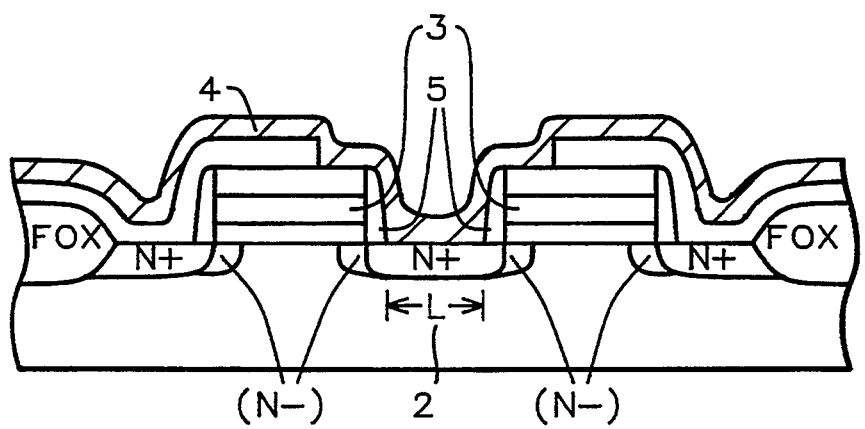
FIG. 2 schematically illustrates in cross-sectional representation a self-aligned contact of the prior art.

In the process of the prior art, the contact area size can be calculated by multiplying the width W of the self-aligned contact, illustrated in FIG. 1, by the length L of the self-aligned contact, illustrated in FIG. 2. The spacing of the polysilicon layer of the gate electrodes can be calculated by adding the length L plus two times the width of the spacer 5.

In the process of the present invention, the contact area can be calculated by multiplying the width of the contact W by the length 1 of the contact, illustrated in FIG. 6A; multiplying two times the width W times the depth d of the trench, illustrated in FIG. 6A; multiplying two times the length l times the depth d; and adding the three resulting quantities. Thus, contact area=Wl+2Wd+2ld. The spacing of the polysilicon gate electrode layers can be calculated by adding the contact length l to two times the width of the spacer 24.

The following table illustrates the contact area in microns squared, the polysilicon spacing in microns, and the polysilicon pitch, (contact width W plus the polysilicon spacing) in microns for the prior art process and for the self-aligned trenched contact (SATC) process of the present invention.

TABLE 1

| process | contact area | poly spacing | poly pitch |
|---|---|---|---|
| W = 0.8, L = 0.8, spacer width = 0.2, poly width = 0.8, l = 0.2, d = 0.24 | | | |
| prior art | 0.64 | 1.2 | 2.0 |
| SATC | 0.64 | 0.6 | 1.4 |

From Table 1, it can be seen that by adopting the SATC process of the present invention, the device area will be smaller than that of the conventional SAC process.

While the invention has been particularly shown and described with reference to the preferred embodiments thereof, it will be understood by those skilled in the art that various changes in form and details may be made without departing from the spirit and scope of the invention.

What is claimed is:

1. The method of forming a self-aligned trenched contact in the fabrication of an integrated circuit comprising:

forming semiconductor device regions in and on a semiconductor substrate wherein said semiconductor device regions include gate electrodes on the surface of said semiconductor substrate and source/drain regions within said semiconductor substrate;

forming spacers on the sidewalls of said gate electrodes;

depositing a layer of silicon oxide over the surface of said substrate wherein said silicon oxide layer contacts said source/drain regions within said substrate between said gate electrodes;

covering said substrate with a layer of photoresist and patterning said photoresist to provide an opening between said gate electrodes;

etching away said silicon oxide using said patterned photoresist and said sidewall spacers as a mask to provide an opening to said semiconductor substrate where said self-aligned trenched contact will be formed;

etching a trench into said semiconductor substrate within said opening using said sidewall spacers as a mask to form said self-aligned trenched opening wherein the depth of said trench within said semiconductor substrate is greater than about 0.25 microns and preferably greater than 0.5 microns; and depositing a conducting layer within said trenched opening to complete said contact in the manufacture of said integrated circuit device.

2. The process of claim 1 wherein said spacers are formed by depositing a layer of silicon oxide over the surface of said semiconductor substrate and anisotropically etching said silicon oxide layer to leave spacers on the sidewalls of said gate electrodes wherein said spacers have a thickness of between about 1000 to 3000 Angstroms.

3. The process of claim 1 wherein said silicon oxide layer is deposited by chemical vapor deposition to a thickness of between about 500 to 1500 Angstroms.

4. The process of claim 1 wherein said silicon oxide layer is etched using a reactive ion etch.

5. The process of claim 1 wherein said trench is etched using a reactive ion etch.

6. The process of claim 1 wherein said conducting layer is formed by depositing a layer of polysilicon over the surface of said substrate and within said trenched opening to a thickness of between about 500 to 4000 Angstroms and wherein said polysilicon layer is ion implanted with one of the group of arsenic and phosphorus ions and wherein outdiffusion forms an N+ contact diffusion region surrounding said trench within said semiconductor substrate.

7. The process of claim 6 wherein said conducting layer further comprises a layer of tungsten silicide with a thickness of between about 500 to 2000 Angstroms overlying said polysilicon layer.

8. The process of claim 1 wherein said conducting layer is formed by depositing an in-situ doped layer of polysilicon over the surface of said substrate and within said trenched opening to a thickness of between about 500 to 4000 Angstroms and wherein outdiffusion forms an N+ contact diffusion region surrounding said trench within said semiconductor substrate.

9. The process of claim 8 wherein said conducting layer further comprises a layer of tungsten silicide with a thickness of between about 500 to 2000 Angstroms overlying said polysilicon layer.

10. The process of claim 1 wherein said conducting layer is formed by implanting one of the group of arsenic and phosphorus ions into said trench and heating said substrate to drive said ions into the region within said substrate surrounding said trench and by depositing a metal layer over the surface of said substrate and within said trench to complete said contact in the fabrication of said integrated circuit.

11. The method of claim 10 further comprising a barrier metal layer deposited conformally over the surface of said substrate and within said trench underlying said metal layer.

12. The method of claim 11 wherein said barrier metal layer is composed of titanium nitride and titanium silicide.

13. The method of claim 11 wherein said barrier metal layer is composed of titanium/tungsten.

14. The method of forming a self-aligned trenched contact in the fabrication of an integrated circuit comprising:

forming semiconductor device regions in and on a semiconductor substrate wherein said semiconductor device regions include gate electrodes on the surface of said semiconductor substrate and source/drain regions within said semiconductor substrate;

forming spacers on the sidewalls of said gate electrodes;

depositing a layer of silicon oxide over the surface of said substrate wherein said silicon oxide layer contacts said source/drain regions within said substrate between said gate electrodes;

covering said substrate with a layer of photoresist and patterning said photoresist to provide an opening between said gate electrodes;

etching away said silicon oxide using said patterned photoresist and said sidewall spacers as a mask to provide an opening to said semiconductor substrate where said self-aligned trenched contact will be formed;

etching a trench into said semiconductor substrate within said opening using said sidewall spacers as a mask to form said self-aligned trenched opening wherein the depth of said trench within said semiconductor substrate is greater than about 0.25 microns and preferably greater than 0.5 microns; and depositing a layer of polysilicon over the surface of said substrate and within said trenched opening wherein said polysilicon layer is ion implanted and wherein outdiffusion forms an N+ contact diffusion region surrounding said trench within said semiconductor substrate to complete said contact in the manufacture of said integrated circuit device.

15. The process of claim 14 wherein said spacers are formed by depositing a layer of silicon oxide over the surface of said semiconductor substrate and anisotropically etching said silicon oxide layer to leave spacers on the sidewalls of said gate electrodes wherein said spacers have a thickness of between about 1000 to 3000 Angstroms.

16. The process of claim 14 wherein silicon oxide layer is deposited by chemical vapor deposition to a thickness of between about 500 to 1500 Angstroms.

17. The process of claim 14 wherein a layer of tungsten silicide with a thickness of between about 500 to 2000 Angstroms is deposited overlying said polysilicon layer.

18. The method of forming a self-aligned trenched contact in the fabrication of an integrated circuit comprising:

forming semiconductor device regions in and on a semiconductor substrate wherein said semiconductor device regions include gate electrodes on the surface of said semiconductor substrate and source/drain regions within said semiconductor substrate;

forming spacers on the sidewalls of said gate electrodes;

depositing a layer of silicon oxide over the surface of said substrate wherein said silicon oxide layer contacts said source/drain regions within said substrate between said gate electrodes;

covering said substrate with a layer of photoresist and patterning said photoresist to provide an opening between said gate electrodes;

etching away said silicon oxide using said patterned photoresist and said sidewall spacers as a mask to provide an opening to said semiconductor substrate where said self-aligned trenched contact will be formed;

etching a trench into said semiconductor substrate within said opening using said sidewall spacers as a mask to form said self-aligned trenched opening wherein the depth of said trench within said semiconductor substrate is greater than about 0.25 microns and preferably greater than 0.5 microns;

implanting ions into said trench and heating said substrate to drive said ions into the region within said substrate surrounding said trench; and depositing a metal layer over the surface of said substrate and within said trench to complete said contact in the manufacture of said integrated circuit device.

19. The process of claim 18 wherein said spacers are formed by depositing a layer of silicon oxide over the surface of said semiconductor substrate and anisotropically etching said silicon oxide layer to leave spacers on the sidewalls of said gate electrodes wherein said spacers have a thickness of between about 1000 to 3000 Angstroms.

20. The process of claim 18 wherein silicon oxide layer is deposited by chemical vapor deposition to a thickness of between about 500 to 1500 Angstroms.

21. The method of claim 18 further comprising a barrier metal layer deposited conformally over the surface of said substrate and within said trench underlying said metal layer.

22. The method of claim 21 wherein said barrier metal layer is composed of titanium nitride and titanium silicide.

23. The method of claim 21 wherein said barrier metal layer is composed of titanium/tungsten.

* * * * *